(12) United States Patent
Wang et al.

(10) Patent No.: US 11,879,928 B2
(45) Date of Patent: Jan. 23, 2024

(54) DIFFERENTIAL PROTECTION OF A TRANSMISSION LINE

(71) Applicant: Hitachi Energy Ltd, Zürich (CH)

(72) Inventors: Jianping Wang, Västerås (SE); Zhanpeng Shi, Västerås (SE); Youyi Li, Västerås (SE)

(73) Assignee: Hitachi Energy Ltd, Zürich (CH)

( * ) Notice: Subject to any disclaimer, the term of this patent is extended or adjusted under 35 U.S.C. 154(b) by 307 days.

(21) Appl. No.: 17/421,442

(22) PCT Filed: Jan. 7, 2020

(86) PCT No.: PCT/EP2020/050160
§ 371 (c)(1),
(2) Date: Jul. 8, 2021

(87) PCT Pub. No.: WO2020/144150
PCT Pub. Date: Jul. 16, 2020

(65) Prior Publication Data
US 2022/0091173 A1    Mar. 24, 2022

(30) Foreign Application Priority Data
Jan. 8, 2019  (EP) .................................... 19150736

(51) Int. Cl.
*G01R 31/08*  (2020.01)
*H02H 1/00*  (2006.01)
*H02H 7/22*  (2006.01)

(52) U.S. Cl.
CPC ......... *G01R 31/086* (2013.01); *H02H 1/0007* (2013.01); *H02H 7/226* (2013.01)

(58) Field of Classification Search
CPC .... G01R 31/086; G01R 31/08; H02H 1/0007; H02H 7/226; H02H 3/08; H02H 7/06; H02H 7/261; H02H 7/04
(Continued)

(56) References Cited

U.S. PATENT DOCUMENTS

| | | | |
|---|---|---|---|
| 3,912,979 A | 10/1975 | Mikami et al. | |
| 4,138,707 A | 2/1979 | Gross | |

(Continued)

FOREIGN PATENT DOCUMENTS

| | | |
|---|---|---|
| CN | 101673941 A | 3/2010 |
| CN | 102195277 A | 9/2011 |

(Continued)

OTHER PUBLICATIONS

Deng, X., et al., "A Novel Current Differential Protection Scheme for Transmission Lines Using Fast Active Current Extraction," International Journal of Control and Automation, vol. 7, No. 7, Jul. 2014, 14 pages.

(Continued)

*Primary Examiner* — Danny Nguyen
(74) *Attorney, Agent, or Firm* — Slater Matsil, LLP

(57) ABSTRACT

There is provided mechanisms for differential protection of a transmission line (20) of a transmission system (25). A method comprises obtaining a restraining current and a differential current from the transmission line (S102). The method comprises determining a compensation current for the differential current (S104). The method comprises providing the differential current as compensated for by the compensation current and the restraining current to a differential protection arrangement for making a trip decision (S106). The method comprises detecting an internal fault for the transmission system (S108). The method comprises, as a result thereof, providing the differential current without being compensated for by the compensation current and the restraining current to the differential protection arrangement for making the trip decision (S110).

21 Claims, 13 Drawing Sheets

(58) Field of Classification Search
USPC .................................................... 361/62–69
See application file for complete search history.

(56) References Cited

U.S. PATENT DOCUMENTS

| | | | |
|---|---|---|---|
| 5,809,045 | A | 9/1998 | Adamiak et al. |
| 6,590,397 | B2 | 7/2003 | Roberts |
| 7,002,784 | B2 | 2/2006 | Wang et al. |
| 7,660,088 | B2 | 2/2010 | Mooney et al. |
| 2004/0090728 | A1 | 5/2004 | Wang et al. |
| 2006/0125486 | A1 | 6/2006 | Premerlani et al. |
| 2007/0081281 | A1 | 4/2007 | Hamer |
| 2010/0191386 | A1 | 7/2010 | Sezi |
| 2011/0063761 | A1* | 3/2011 | Kasztenny ............ H02H 7/045 361/36 |
| 2011/0063767 | A1 | 3/2011 | Kasztenny et al. |
| 2013/0035882 | A1 | 2/2013 | Wahlroos et al. |

FOREIGN PATENT DOCUMENTS

| | | |
|---|---|---|
| CN | 103296648 A | 9/2013 |
| CN | 103427405 A | 12/2013 |
| CN | 104779591 A | 7/2015 |
| CN | 105846405 A | 8/2016 |
| CN | 107706890 A | 2/2018 |
| EP | 2375525 A1 | 10/2011 |
| JP | S49121944 A | 11/1974 |
| JP | H09168228 A | 6/1997 |
| JP | H09200945 A | 7/1997 |
| NO | 2016074198 A1 | 5/2016 |
| SE | 0002632 L | 1/2002 |
| WO | 2009000304 A1 | 12/2008 |
| WO | 2011035055 A1 | 3/2011 |

OTHER PUBLICATIONS

ABB Power Technologies AB, "Application Manual, Line differential protection IED, Red 670," Document No. 1MRK 505 135-UEN, Revison: A, Jan. 2006, 514 pages.

ABB, "Line differential protection L4CPDIF Function Block Manual," Document ID: 1MRK 580 459-XEN, Jun. 2016, 66 pages.

Siemens, "Siprotec 4 Line Differential Protection with Distance Protection 7SD5," Manual, V4.7, C53000-G1176-C169-6, May 2016, 768 pages.

* cited by examiner

DIFFERENTIAL PROTECTION OF A TRANSMISSION LINE

CROSS-REFERENCE TO RELATED APPLICATIONS

This application is a national stage application of International Application No. PCT/EP2020/050160, filed on Jan. 7, 2020, which claims priority to European Patent Application No. 19150736.7, filed on Jan. 8, 2019, which applications are hereby incorporated herein by reference.

TECHNICAL FIELD

Embodiments presented herein relate to a method, an arrangement, a computer program, and a computer program product for differential protection of a transmission line of a transmission system.

BACKGROUND

In power transmission systems, long transmission lines might have quite high capacitive charging currents. A real-time compensation of capacitive currents might therefore be needed to increase the dependability of ultra high voltage (UHV) line differential protection, especially during internal faults with high fault impedances.

Existing mechanisms for line differential protection are commonly based on subtracting the measured or calculated differential current during normal operation conditions and to continue to compensate for the differential current even during an internal fault period, which is less sensitive for high impedance ground faults. This is acceptable for short transmission line application conditions as the capacitive charging current is not so high in the short transmission line conditions for low impedance internal faults. When the transmission line becomes longer, especially for UHV lines, the corresponding capacitive charging current will be quite higher during normal operation conditions.

The existing mechanism of continuous compensation of the capacitive charging current, even during the internal fault period, will not only reduce the dependency of the line differential protection, but also the compensated charging current during internal fault condition might not be correct. One reason for this is that the actual voltage along the transmission line during the internal fault period might not be the same as the case during normal operating conditions.

Hence, there is still a need for improved line differential protection mechanisms.

SUMMARY

An object of embodiments herein is to provide efficient line differential protection of a transmission line of a transmission system which does not suffer from the issues noted above or at least where these issues are reduced or mitigated.

According to a first aspect there is presented a method for differential protection of a transmission line of a transmission system. The method comprises obtaining a restraining current and a differential current from the transmission line. The method comprises determining a compensation current for the differential current. The method comprises providing the differential current as compensated for by the compensation current and the restraining current to a differential protection arrangement for making a trip decision. The method comprises detecting an internal fault for the transmission system. The method comprises, as a result thereof, providing the differential current without being compensated for by the compensation current and the restraining current to the differential protection arrangement for making the trip decision.

According to a second aspect there is presented an arrangement for differential protection of a transmission line of a transmission system. The arrangement comprises processing circuitry. The processing circuitry is configured to cause the arrangement to obtain a restraining current and a differential current from the transmission line. The processing circuitry is configured to cause the arrangement to determine a compensation current for the differential current. The processing circuitry is configured to cause the arrangement to provide the differential current as compensated for by the compensation current and the restraining current to a differential protection arrangement for making a trip decision. The processing circuitry is configured to cause the arrangement to detect an internal fault for the transmission system. The processing circuitry is configured to cause the arrangement to, as a result thereof, provide the differential current without being compensated for by the compensation current and the restraining current to the differential protection arrangement for making the trip decision.

Advantageously this provides efficient differential protection of the transmission line that does not suffer from the issues noted above.

Advantageously, by using adaptive compensation, the differential current will be compensated to very low level during normal operation conditions (and external fault conditions), whilst keeping the original differential current during internal fault conditions to obtain the best dependency and security for the line differential protection.

According to a third aspect there is presented a computer program for differential protection of a transmission line of a transmission system, the computer program comprising computer program code which, when run on an arrangement, causes the arrangement to perform a method according to the first aspect.

According to a fourth aspect there is presented a computer program product comprising a computer program according to the third aspect and a computer readable storage medium on which the computer program is stored. The computer readable storage medium could be a non-transitory computer readable storage medium.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art.

Like numbers refer to like elements throughout the description. Any step or feature illustrated by dashed lines should be regarded as optional.

Figure 1:
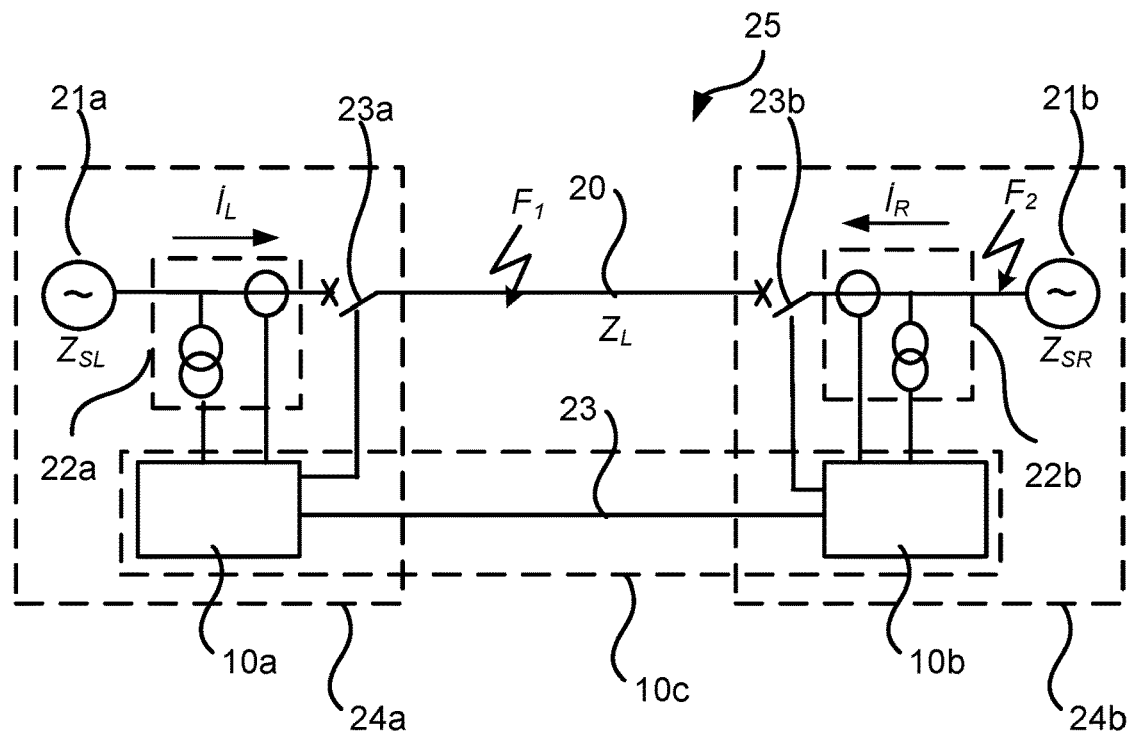
FIGS. 1, 2, 3 are schematic diagrams illustrating transmission systems according to embodiments.

FIG. 1 schematically illustrates a transmission system 25 of a power distribution system where the herein disclosed embodiments apply. The transmission system 25 comprises at least one arrangement 10a, 10b for differential protection of a transmission line 20 of the transmission system 25. Two or more arrangements 10a, 10b may be operatively connected via a communications link 23. Further, two or more arrangements 10a, 10b may be part of a common arrangement 10c for differential protection of the transmission line 20. The arrangement 10a, 10b may be part of, or comprise, an intelligent electronic device (IED) operating as a relay. The transmission system 25 further comprises power sources 21a, 21b, current and voltage transformers 22a, 22b, and circuit breakers 23a, 23b. F1 and F2 denote external and internal faults, respective, along the transmission line 20. The transmission line 20 might be an ultrahigh voltage (UHV) transmission line 20. The transmission line 20 might be part of a power distribution system.

The embodiments disclosed herein relate to mechanisms for differential protection of the transmission line 20 of the transmission system 25. In order to obtain such mechanisms there is provided an arrangement 10a, 10b, 10c, a method performed by the arrangement 10a, 10b, 10c, a computer program product comprising code, for example in the form of a computer program, that when run on an arrangement 10a, 10b, 10c, causes the arrangement 10a, 10b, 10c to perform the method.

The herein disclosed mechanisms overcome the above mentioned issues of current mechanisms for differential line protection by providing adaptive capacitive charging current compensation for transmission line differential protection. The compensation for the capacitive current is, upon detection of an internal fault, disabled so that the final differential current is equal to the originally determined differential current.

Aspects of a two terminal transmission line will now be disclosed.

Figure 2:
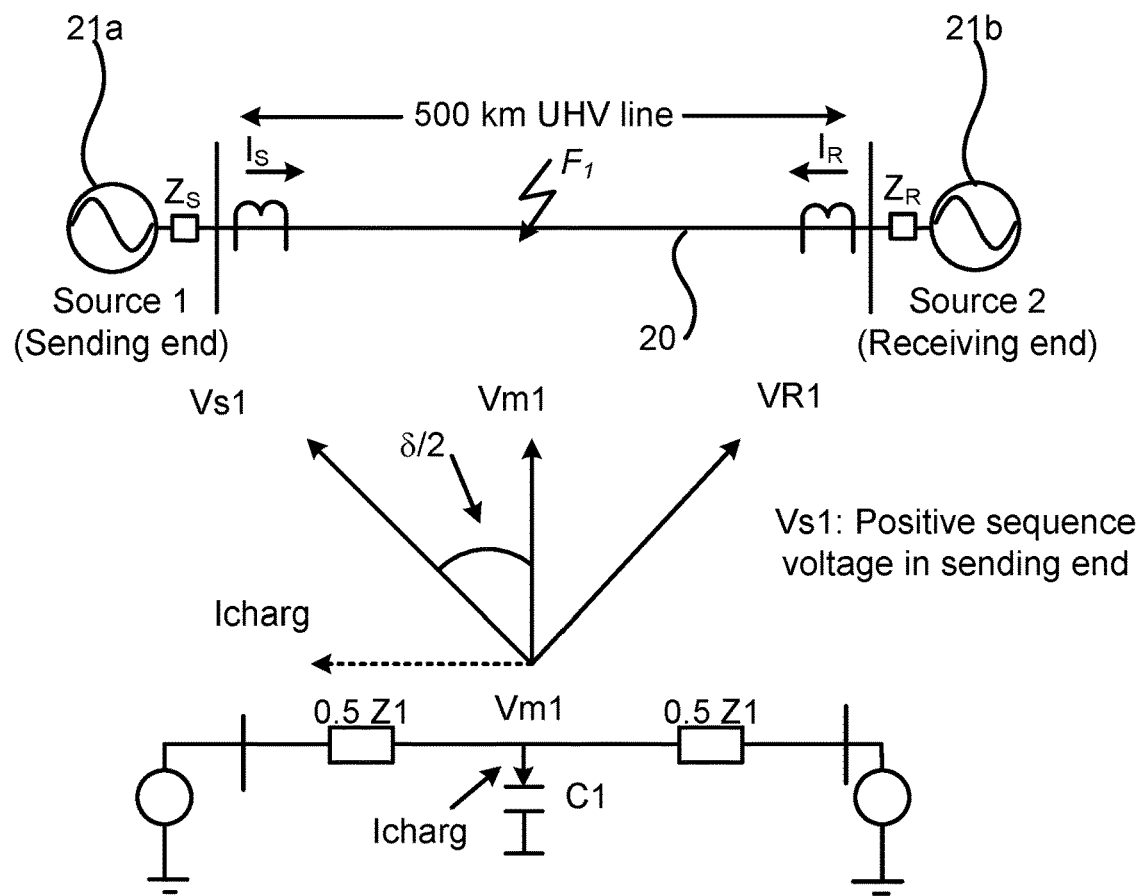

FIG. 2 illustrates a simplification of the transmission system of FIG. 1 where the transmission line is represented as a typical two terminal transmission system.

The related vectors in FIG. 2 indicate related positive sequence vectors along the transmission line, respectively: Vs1 is the sending end positive sequence voltage, Vr1 is the receiving end positive sequence voltage, Vm1 is the middle point positive sequence voltage, and $I_{charg}$ is the capacitive charging current during normal load conditions. Assuming that the load angle between Vs1 and Vr1 is δ, the middle point positive sequence voltage Vm1 will lag half of δ with vector Vs1. $I_{charg}$ is always 90 degrees ahead of Vm1 as indicated in the middle of FIG. 2. In the bottom of FIG. 2 is illustrated the equivalent positive sequence network for the given transmission system. C1 is the positive sequence leakage capacitance in total line and Z1 is the total line positive sequence impedance.

The capacitive charging currents in each phase during normal operating conditions, could be calculated based on the positive sequence network as given in the bottom of FIG. 2 where C1 is the positive sequence capacitance by considering phase A as starting phase within three phase systems:

$$I_{charg\_a}(t) = j2\pi f C_1 Vm1(t)$$

$$I_{charg\_b}(t) = a^2 \times I_{charg\_a}(t)$$

$$I_{charg\_c}(t) = a \times I_{charg\_a}(t) \tag{1}$$

Here, a=−0.5+j0.866, which is the rotation factor for a three phase transmission power system.

In the phasor domain, the middle point voltage Vm1 can be calculated based on the positive sequence network as given in the bottom of FIG. 2 based on a T-type lumped equivalent circuit as given in equation (2). Here, Is1 is the positive sequence current measured in the sending end.

$$Vm1(t) = Vs1(t) - Is1(t) \times 0.5 Z1 \tag{2}$$

For a three phase transmission line, each phase capacitive charging current can be calculated based on equations (1), (2), or alternatively, by first calculating phase A capacitive current and then rotating the phase A capacitive current with +120 degrees by multiply rotation factor "a" for phase C and −120 degrees for phase B by multiplying "$a^2$" based on three phase system signal relations as given in equation (1).

The calculated capacitive currents ($I_{charge\_a}$, $I_{charg\_b}$, $I_{charg\_c}$) for each phase based on equations (1), (2) are perfectly matching with the actual differential current ($I_{d\_a}$, $I_{d\_b}$, $I_{d\_c}$) in each phase during normal load conditions. The differential currents and restraining currents ($I_{res\_a}$, $I_{res\_b}$, $I_{res\_c}$) of each phase are calculated based on the instantaneous currents as synchronized signals from both the sending end currents ($I_{s\_a}$, $I_{s\_b}$, $I_{s\_c}$) and the receiving end currents ($I_{r\_a}$, $I_{r\_b}$, $I_{r\_c}$), which can be obtained using equations (3)-(8) below. Using phase A as an example, general criteria for a differential protection function can be given by equation (9).

$$I_{d\_a}(t) = I_{s\_a}(t) + I_{r\_a}(t) \tag{3}$$

$$I_{d\_b}(t) = I_{s\_b}(t) + I_{r\_b}(t) \tag{4}$$

$$I_{d\_c}(t) = I_{s\_c}(t) + I_{r\_c}(t) \tag{5}$$

$$I_{res\_a}(t) = 0.5 \times (|I_{s\_a}(t)| + |I_{r\_a}(t)|) \tag{6}$$

$$I_{res\_b}(t) = 0.5 \times (|I_{s\_b}(t)| + |I_{r\_b}(t)|) \tag{7}$$

$$I_{res\_c}(t) = 0.5 \times (|I_{s\_c}(t)| + |I_{r\_c}(t)|) \tag{8}$$

$$I_{d\_a\_rms}(t) - k1 \times I_{res\_a\_rms}(t) > \text{Threshold1} \tag{9}$$

Here k1 is the restrain coefficient, which is below 1 and takes a value in the range 0.2 to 0.6 in general. Threshold1 is a positive value which is normally around 20% of nominal load current. $I_{d\_a\_rms}(t)$ is the root mean square (RMS) value of phase A differential current $I_{d\_a}(t)$ and $I_{res\_a\_rms}(t)$ is the root mean square (RMS) value of phase A restraining current $I_{res\_a}(t)$.

Aspects of a multi-terminal transmission line will now be disclosed.

In case of a multi-terminal transmission line, the same principles can be applied. The positive sequence capacitance C1 will be then replaced by the total summation of the connected line positive sequence capacitances denoted $C_{1\Sigma}$. The middle point voltage in the positive sequence network will be calculated based on the equivalent positive sequence network. The middle point will be along the transmission line between the two most separated terminals within the multi-terminal transmission line system. The total equivalent capacitance can be calculated as below in equation (10) if assumed that there are "M" terminals connected in the differential zone:

$$C_{1\Sigma} = \Sigma_{k=1}^{M} C_{1k} \quad (10)$$

The total charging current (using phase A as example) can be calculated as in equation (11) below.

$$I_{charg\_a}(t) = j2\pi f C_{1\Sigma} Vm1(t) \quad (11)$$

Here, $Vm1(t)$ is the middle point voltage in the positive sequence network along the transmission line between the two most separated terminals within the multi-terminal transmission line system. Capacitive currents for phases B and C could also be obtained by using the same rotation factors as indicated in equation (1).

Figure 3:
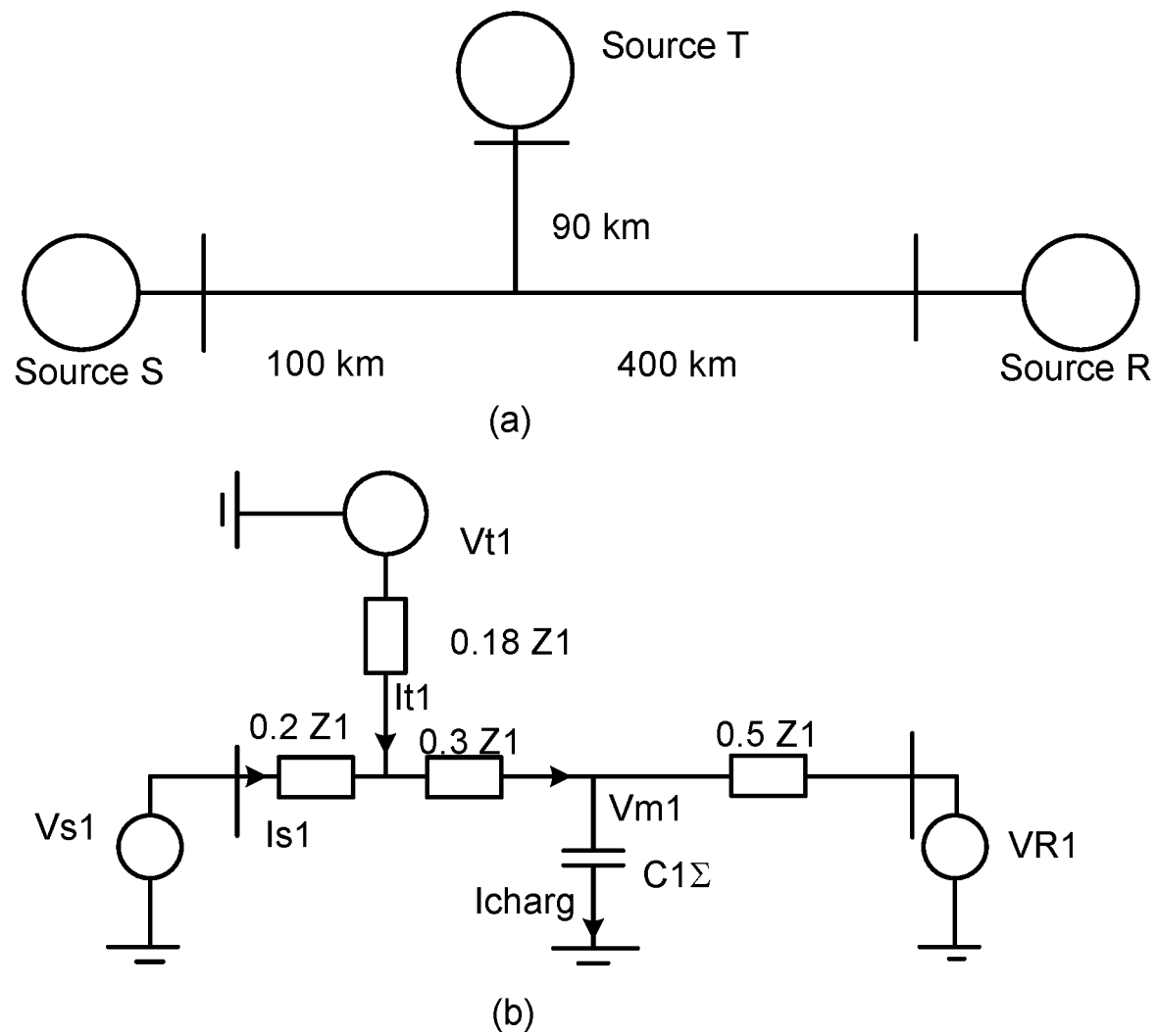

An example of a three terminal connected network is shown in FIG. 3. Three sources are connected as a three-terminal system. Here the longest line between two terminals is the transmission line between source S and source R. The middle point is 250 km in this longest transmission line. Vs1, Vr1, Vt1, Is1, and It1 are the related positive sequence voltages and currents for the calculation. Z1 is the positive sequence impedance for the 500 km overhead line. If different types of transmission lines are used in the multi-terminal line system, corresponding modification of the positive sequence network impedance values need to be modified.

Based on the positive sequence network, the middle point voltage Vm1 can be calculated as expressed in equation (12) below and the final capacitive charging current can be calculated based on equations (10) and (11).

$$Vm1(t) = Vs1(t) - Is1(t) \times 0.2Z1 - (Is1(t) + It1(t)) \times 0.3Z1 \quad (12)$$

Aspects of real time capacitive current compensation for line differential protection applications will now be disclosed by considering the phase A loop as an example.

The real time capacitive current calculation and compensation could be used for line differential protection, which can improve the security for line differential protection as the compensation could compensate the differential current to almost zero level during normal load conditions. The compensation could be obtained by using equation (13) below for each phase respectively:

$$I_{d\_comp\_a}(t) = I_{d\_a}(t) - I_{charg\_a}(t)$$

$$I_{d\_comp\_b}(t) = I_{d\_b}(t) - I_{charg\_b}(t)$$

$$I_{d\_comp\_c}(t) = I_{d\_c}(t) - I_{charg\_c}(t) \quad (13)$$

Figure 4:
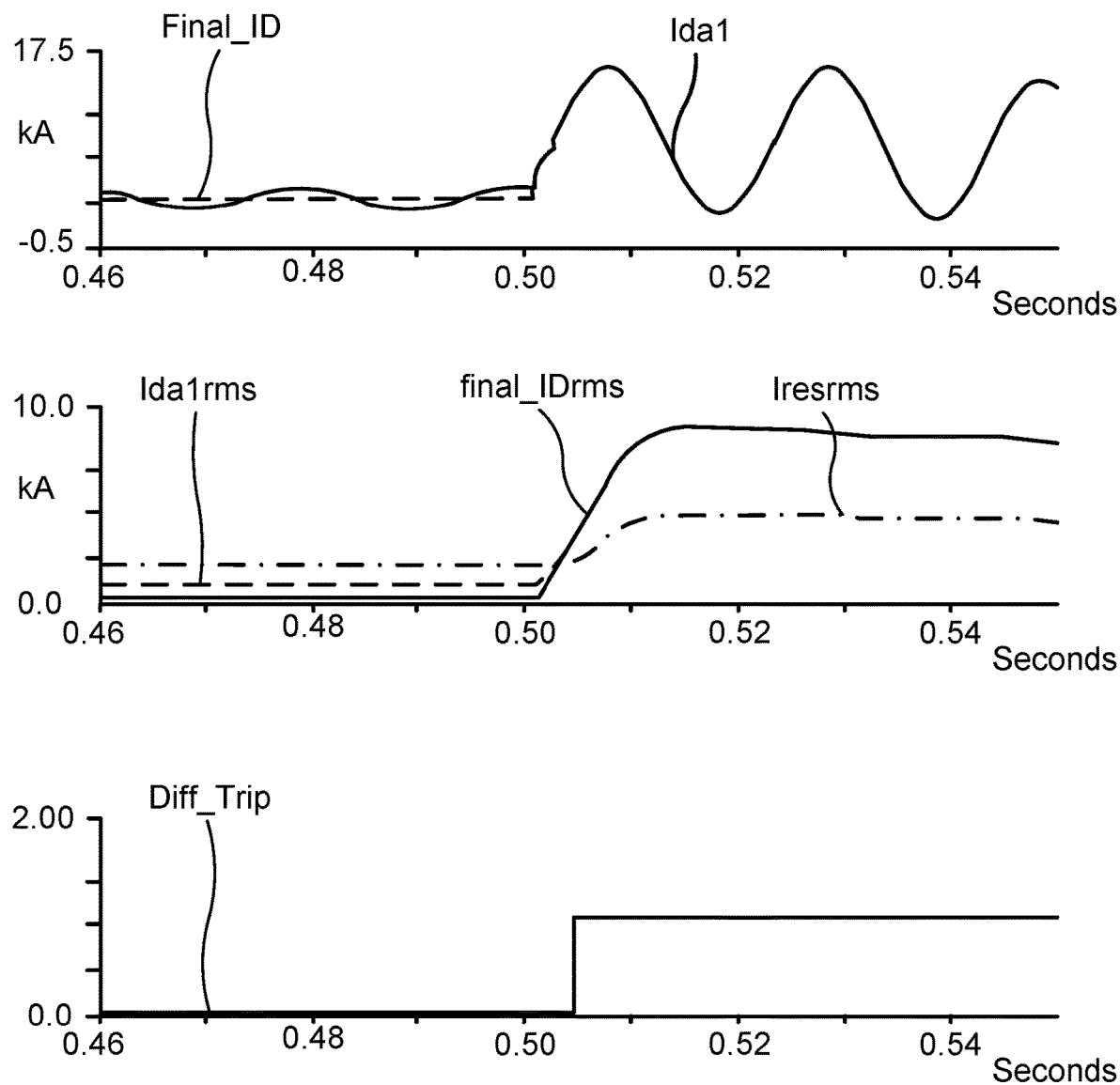
FIGS. 4, 5, 6, 7, 8, 10, illustrate current values according to embodiments.

On the other hand, the compensation could be either switched off in case of disturbance created by the internal faults so that the differential current will be equal to the actual differential current or controlled in case of external fault conditions FIG. 4 shows the internal fault condition with phase A to ground fault (solid ground fault) by considering the phase A loop as an example. Here the signal final_ID is the compensated differential current in phase A. Ida1 (Ida1=Ida(t)) is the original differential current (uncompensated differential current) in phase A. It is shown that the compensated differential current final_ID is almost zero during normal condition and then it is switched back to original differential current Ida1 once an internal fault is detected. Ida1rms (Ida1rms=Id_a_rms(t)) is the root mean square value (RMS) of differential current in phase A. Iresrms (Iresrms=Ires_a_rms(t)) is the RMS value for restraining current for phase A. Final_IDrms is the RMS value of compensated differential current in phase A. The signal Diff_Trip is the final trip signal for the internal fault condition. In this case, the trip signal is set to value 1 after 5 ms based on general differential protection restrain characteristics. It is clear that the compensation has created positive effect for the security of line differential protection during normal condition and it does not influence the dependency of protection during internal solid fault condition.

Figure 5:
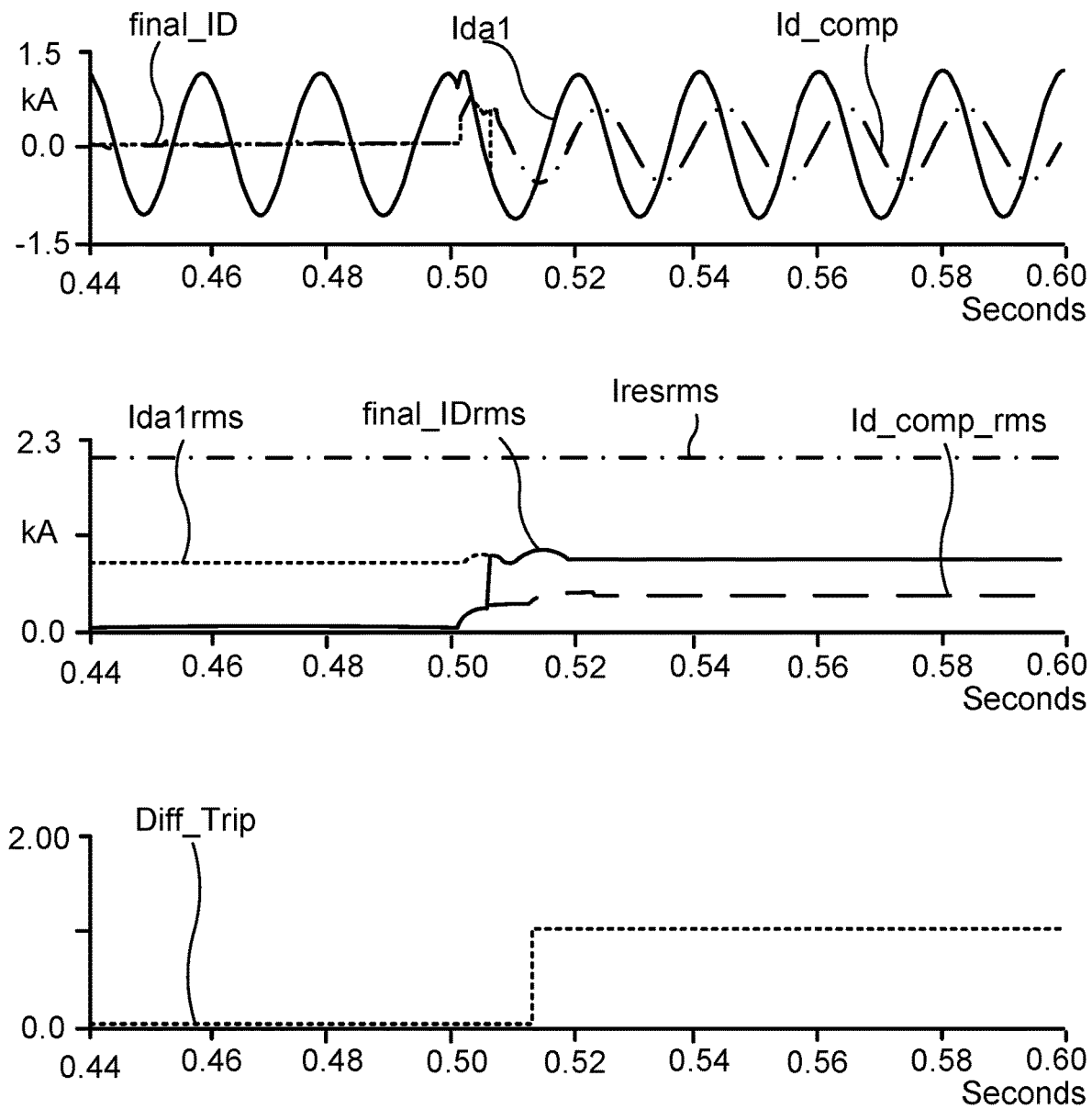

For internal fault with high impedance fault condition, the compensated differential current will be reduced a lot because the high impedance fault does not create obvious changes both for voltages and currents. The differential and restraining currents in each phase will thus have limited changes. FIG. 5 shows the high impedance fault in phase A with fault impedance as 1000 ohms. A trip signal Diff_Trip is set to value 1 after 10 ms. As seen in FIG. 5, the original differential current Ida1 (Ida1=Ida(t)) in phase A does not change so much during the internal fault period for the high impedance ground fault. On the other hand, the capacitive leakage current for the given transmission line is almost close to 1000 Ampere peak value. If the compensation for the differential current Id_comp (Id_comp=Id_comp_a(t)) is kept, it will reduce the dependency of the differential protection during fault period. The related RMS value is Id_com_rms. The dependency of the differential protection will be influenced. In this condition, it is advantageous to switch back to the original differential current once the internal fault is detected as shown in FIG. 5 with signals final_ID and final_IDrms. In this way, better dependency is obtained.

Figure 6:
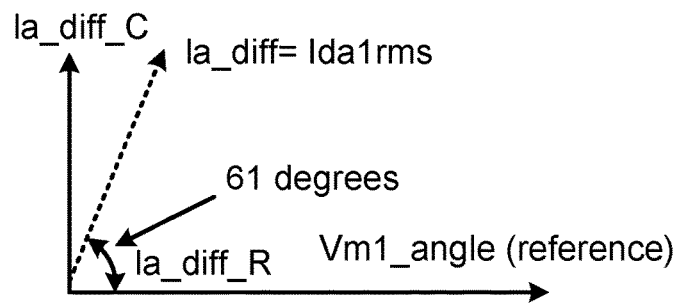
Figure 6:
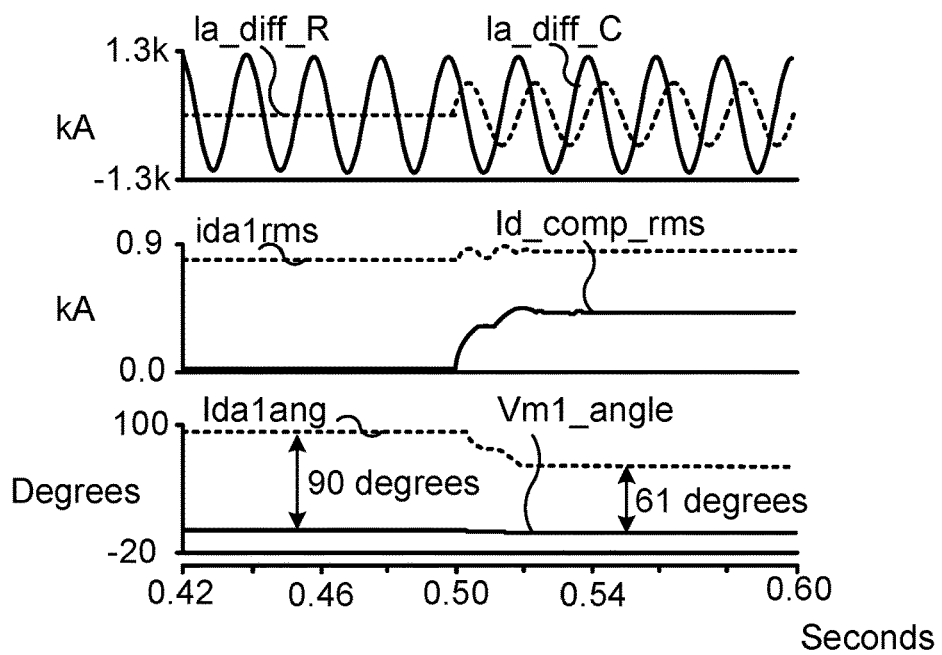
Figure 6:
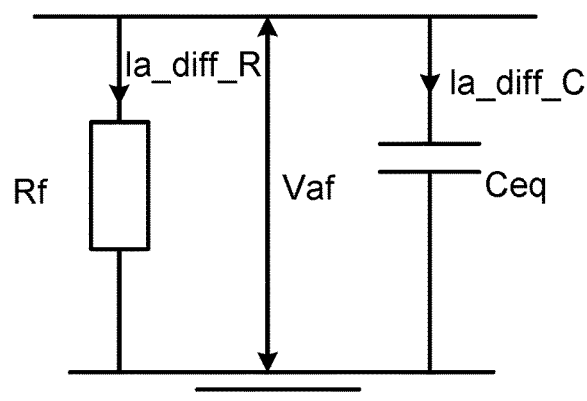

This high impedance fault condition during internal fault in phase A is further illustrated with reference to FIG. 6. The vector diagram in FIG. 6-(a) indicates the fault period differential current (IA_diff) and related capacitive charging current (IA_diff_C) and fault resistance current (IA_diff_R). FIG. 6-(b) indicates the instantaneous signals and RMS value of those signals. From the middle window of FIG. 6-(b) it can be seen that the compensated differential current RMS value (Id_comp_rms) is much lower than the uncompensated differential current RMS value idairms (idcurms=Id_a_rms(t)). In the illustrative example of FIG. 6, Ia_diff_R=425 A, Ia_diff_C=900 A, Ia_diff=995 A, and Id_comp_rms=425 A. It can also be seen that the uncompensated differential current angle is 90 degrees ahead of the middle point positive sequence voltage vector angle and it is 61 degrees ahead of the middle point positive sequence voltage during fault period which is in line with FIG. 6-(a). FIG. 6-(c) gives an equivalent circuit of phase A to ground fault with high impedance Rf. Here Ceq is the equivalent positive sequence capacitance in phase A. Vaf is the phase A to ground voltage, which is close to the measured Vm1 for the high impedance fault.

Figure 7:
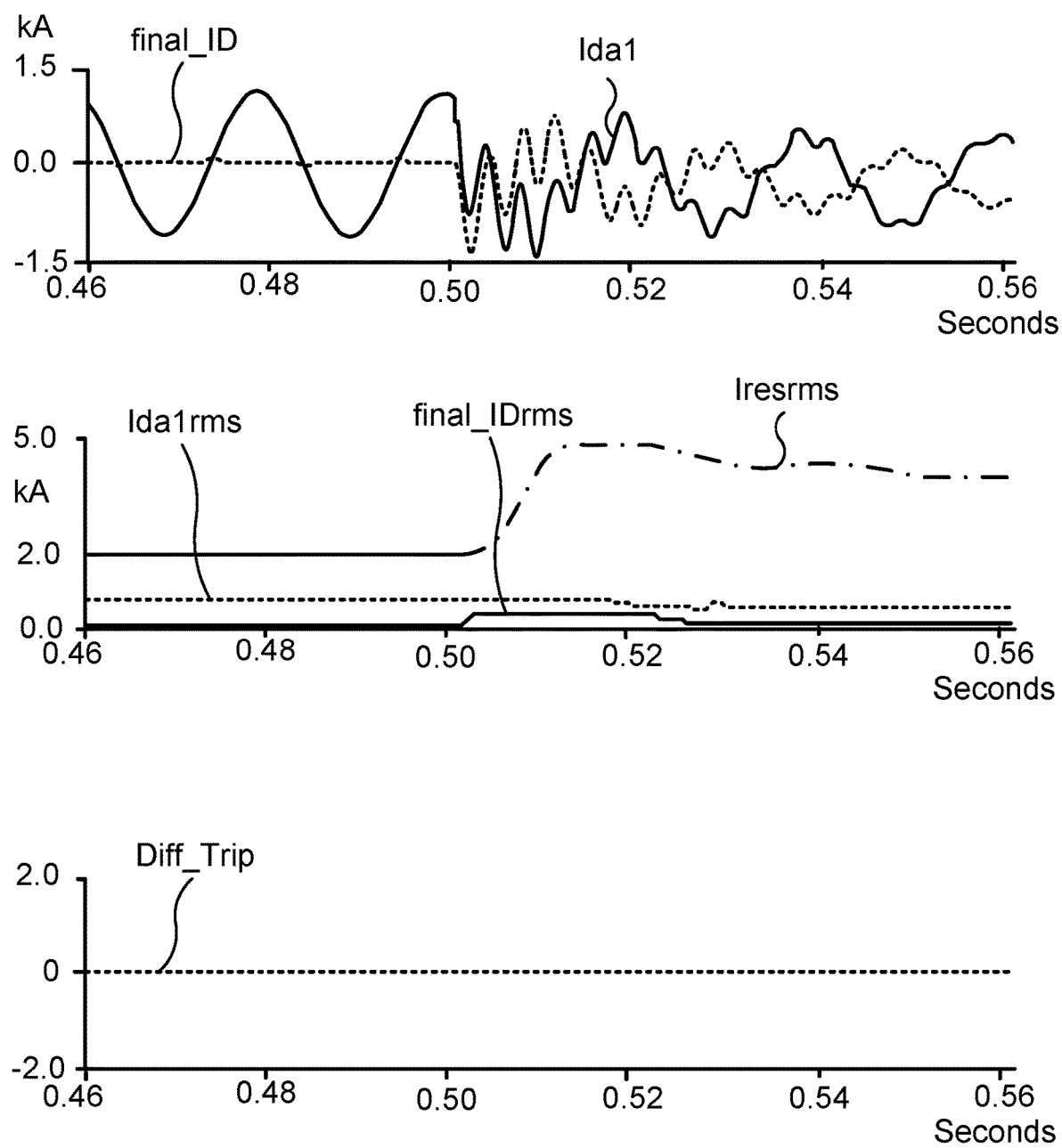

For external faults, theoretically, the differential current will be zero based on sending end and receiving end current directionalities. In practice, especially for long transmission line conditions, the final differential current as seen in FIG. 7 as Ida1 is not zero during the external fault period with solid ground fault due to possible errors created by current transformer saturation, measurement errors, etc. From a security point of view, it can be advantageous to keep the differential current to zero. An external fault detection switch might therefore be used to switch the differential current to zero once an external fault is detected. Another way is to keep the differential current as original differential current as Ida1 if an external fault is detected.

Aspects of internal fault and external fault detection will now be disclosed.

For internal fault detection, the following criteria as given below in equations (14), (15), (16) can be used by considering phase A as an example. Here, t is the time instant and T is one fundamental cycle time for related power systems.

$$\Delta I_{d\_a}(t) = \Delta I_{da}(t) = I_{d\_a}(t) - I_{d\_a}(t-T) \quad (14)$$

$$\Delta I_{res_a}(t) = \Delta I_{ra}(t) = I_{res\_a}(t) - I_{res\_a}(t-T) \quad (15)$$

$$\Delta I_{da\_angle}(t) = \Delta I_{da\_angle}(t) = I_{d\_a\_angle}(t) - I_{d\_a\_angle}(t-T) \quad (16)$$

Here, equation (14) is the calculation for changes of differential current in phase A, equation (15) is the calculation for changes of restraining current in phase A, and equation (16) is the calculation of angle changes in differential current in phase A.

The internal fault might create a sudden increase of differential currents, or restraining currents, in the related fault phases. In parallel, the differential current angle will be decreased from the total capacitive current condition to a combination of both capacitive current with resistive current, as shown in FIG. 6-(a). The decrease of the differential current angle will depend on the fault resistance level. The equations (14)-(16) are general expressions by using phase A as an example, which can be applied for each phase calculations for the sudden changes of differential currents, restraining currents and angles of differential currents and it is possible to use alternative methods such as using two cycle data instead of one cycle data to obtain above sudden change values.

Figure 8:
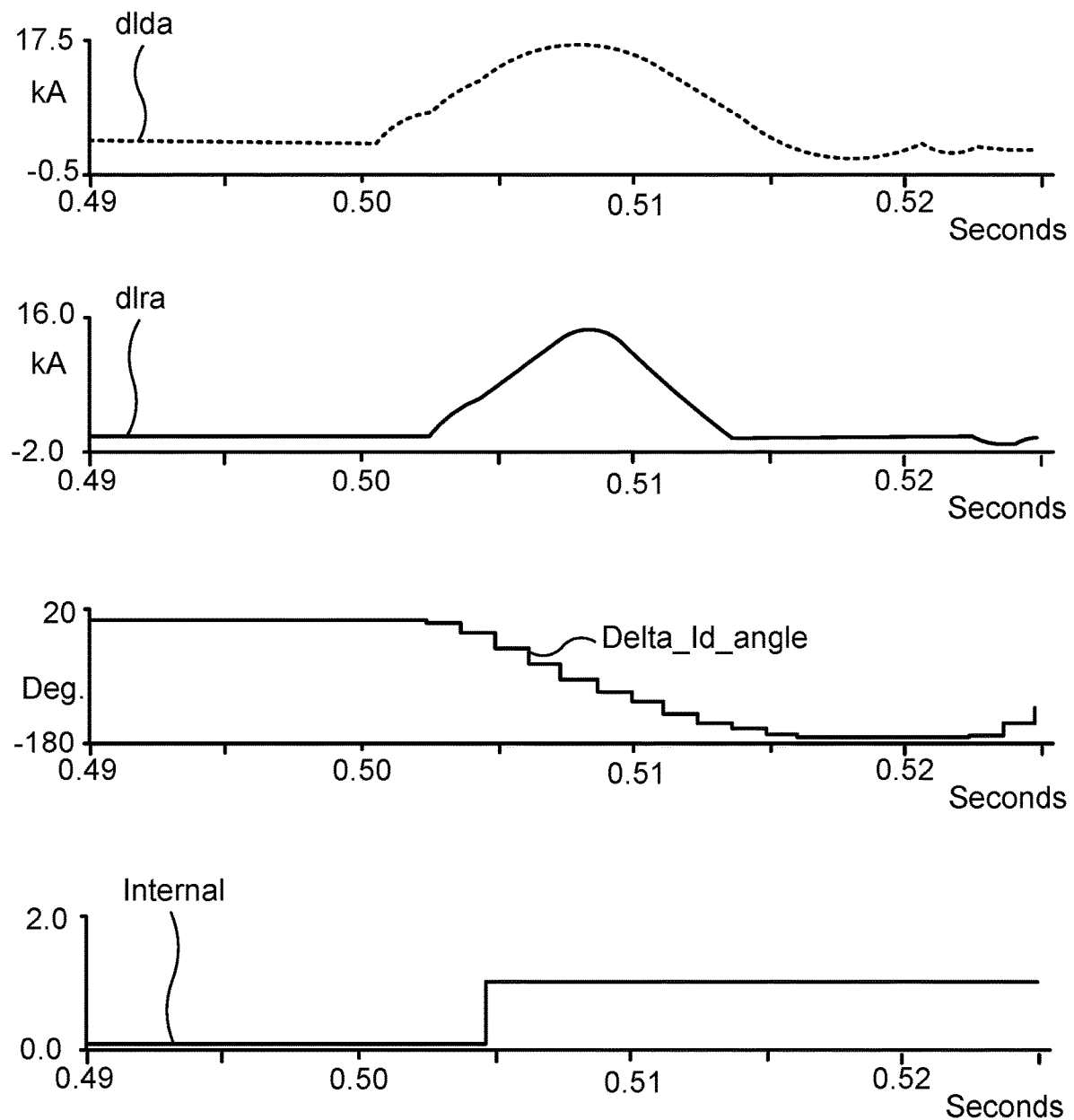
Figure 9:
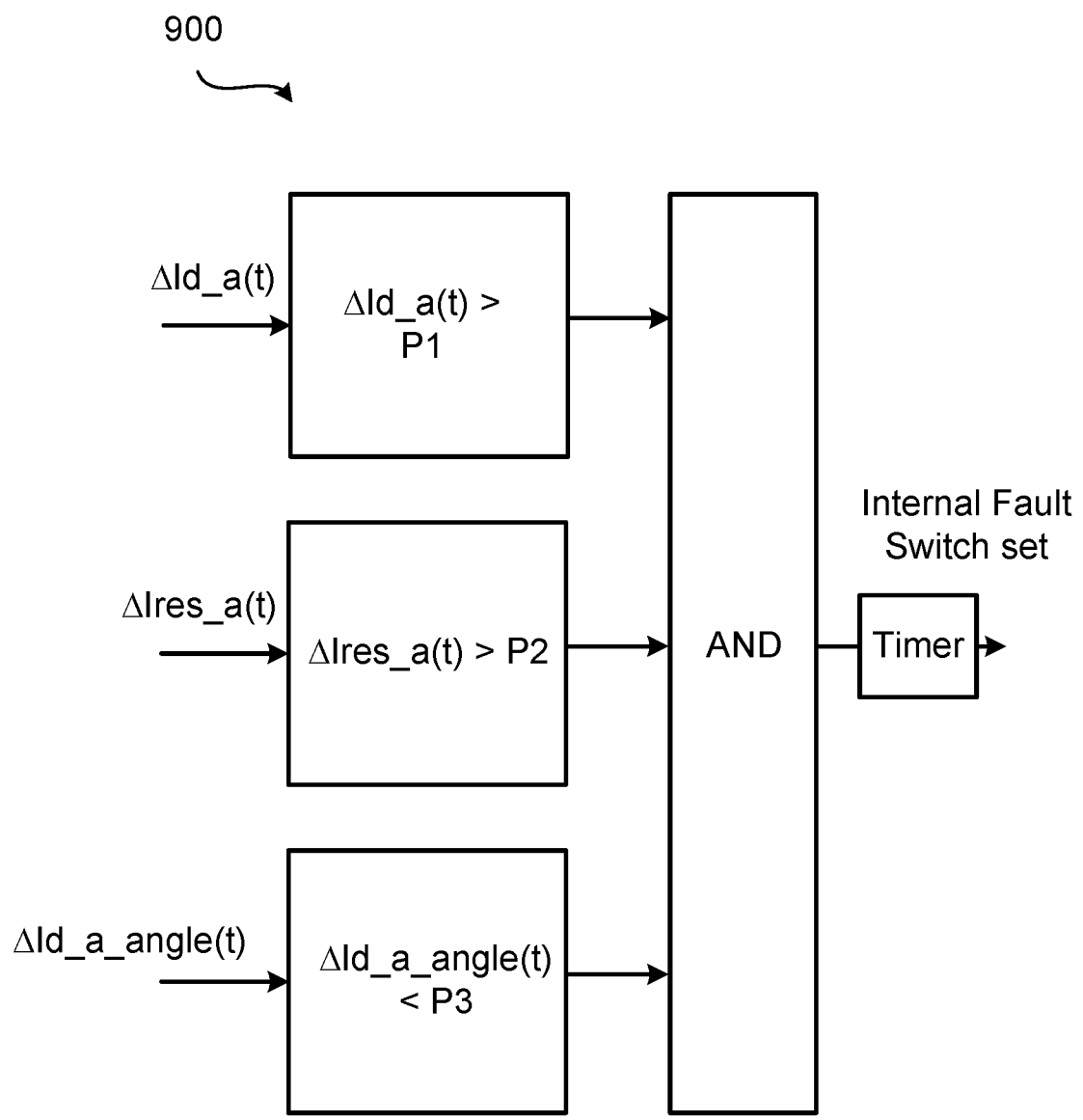
FIGS. 9, 11, 12 are schematic diagrams illustrating differential protection arrangements, or parts thereof, according to embodiments.

FIG. 8 and FIG. 9 show that the internal fault detection switch can be successfully used for an internal fault case and show that the logic works both for solid faults and high impedance faults. With respect to FIG. 12, which will be described below, FIG. 9 illustrates a scheme 900 of the internal fault detection switch by considering phase A as an example. In case of internal faults, the internal fault switch will be set to 1 so that the compensation will be disabled, and the actual differential current will be used in the differential protection. In this way, the sensitivity of the differential protection is increased.

Figure 10:
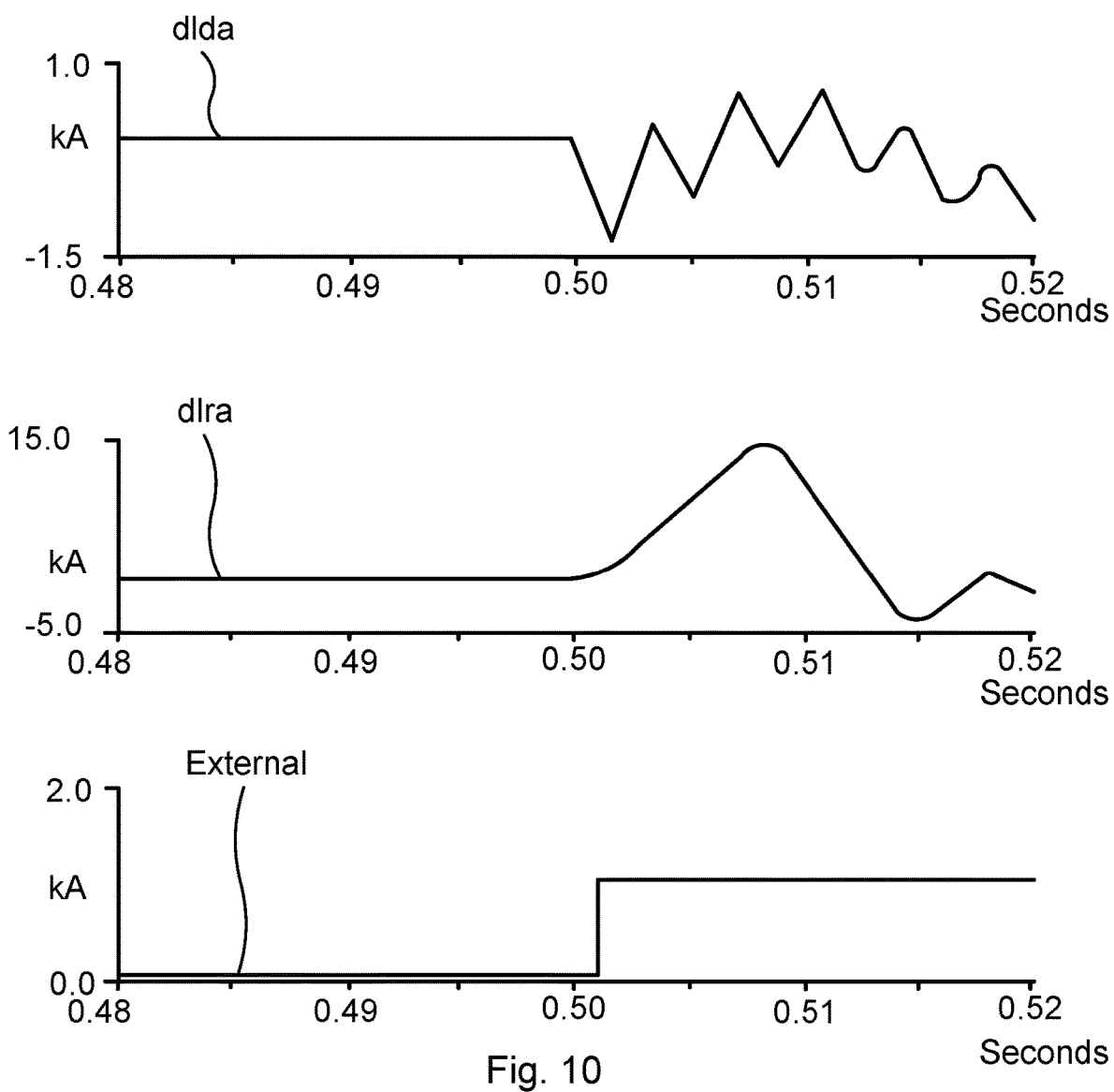
Figure 11:
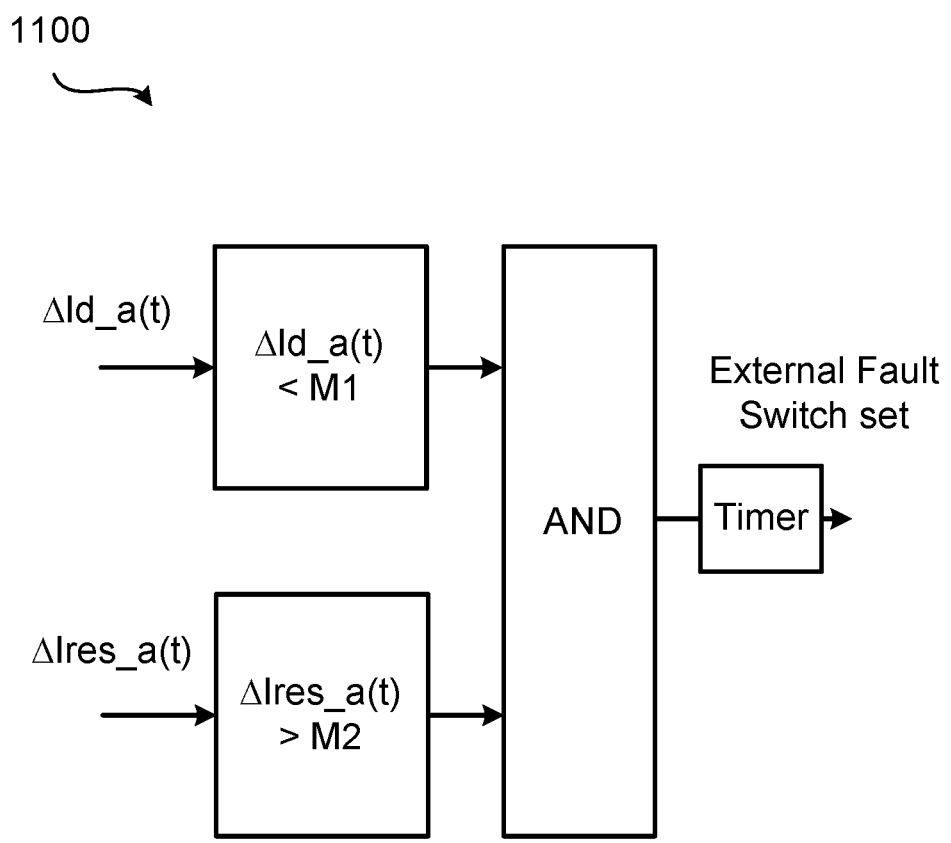

For external faults, the corresponding differential currents of the faulty phases will decrease immediately due to the current directional changes in the external faults. The restraining currents will increase immediately following the fault inception because of high fault currents feeding to the fault point. The changes of differential currents and restraining currents in the faulted phases can be used to detect external faults. The basic concept is to detect the decrease of differential current and sudden increase of restraining current that will give an efficient identification of external faults. For a current transformer (CT) saturation condition, it is still possible to detect the external fault if the CT will not saturate within 1-2 ms after each zero-crossing point. This condition for most of line protection scheme will be fulfilled because line CTs do not have big ratio differences. FIG. 10 and FIG. 11 show an example for the external fault in the busbar of receiving end substation as shown in FIG. 2. With respect to FIG. 12, which will be described below, FIG. 11 illustrates a scheme 1100 of the external fault detection switch by considering phase A as an example. When an external fault is detected, the external fault switch will be set to 1 so that the differential current will be set to zero.

Figure 12:
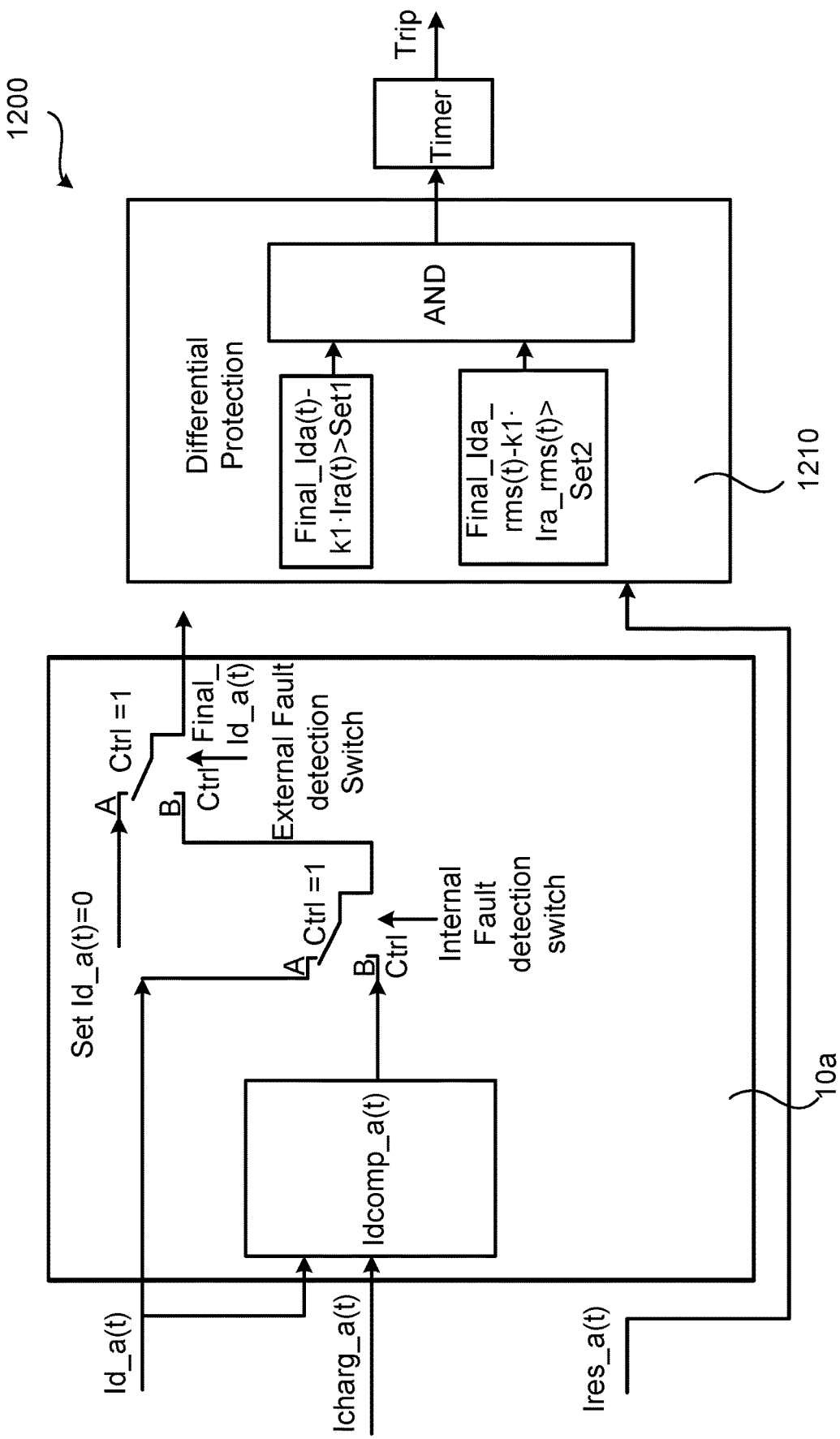

The overall differential protection scheme 1200 with adaptive capacitive current compensation in the arrangement 10a is shown in FIG. 12 by using phase A as an example. In FIG. 12, Set1 is the threshold value for instantaneous differential protection criterion, as performed in a differential protection arrangement 1210, and Set2 is the threshold value for the RMS based differential protection criterion. K1 is a ratio value which is normally set to 0.5. The arrangement 10a comprises an external fault detection switch (as illustrated in FIG. 11 in more detail) and an internal fault detection switch (as illustrated in FIG. 9 in more detail). When Ctrl=1 for the external fault detection switch it is set to position A, and else it is set to position B. When Ctrl=1 for the internal fault detection switch it is set to position A, and else it is set to position B. Hence, the two signals Ctrl can be used to control the position of the external fault detection switch and the position of the internal fault detection switch.

$I_{d\_comp\_a}(t)$ is determined from $I_{d\_a}(t)$ and $I_{charg\_a}(t)$ according to equation (13).

Further, Final_Ida(t) is the real time differential current for phase A and the RMS value of Final_Ida(t) is denoted Final_Ida_rms(t) and is continuously calculated based on fundamental power frequency cycle time T as given below in equation (17).

$$\text{Final\_Ida\_rms}(t) = \sqrt{\frac{1}{T}\int_{t-T}^{t}(\text{Final\_Ida}(t))^2 dt} \quad (17)$$

Figure 13:
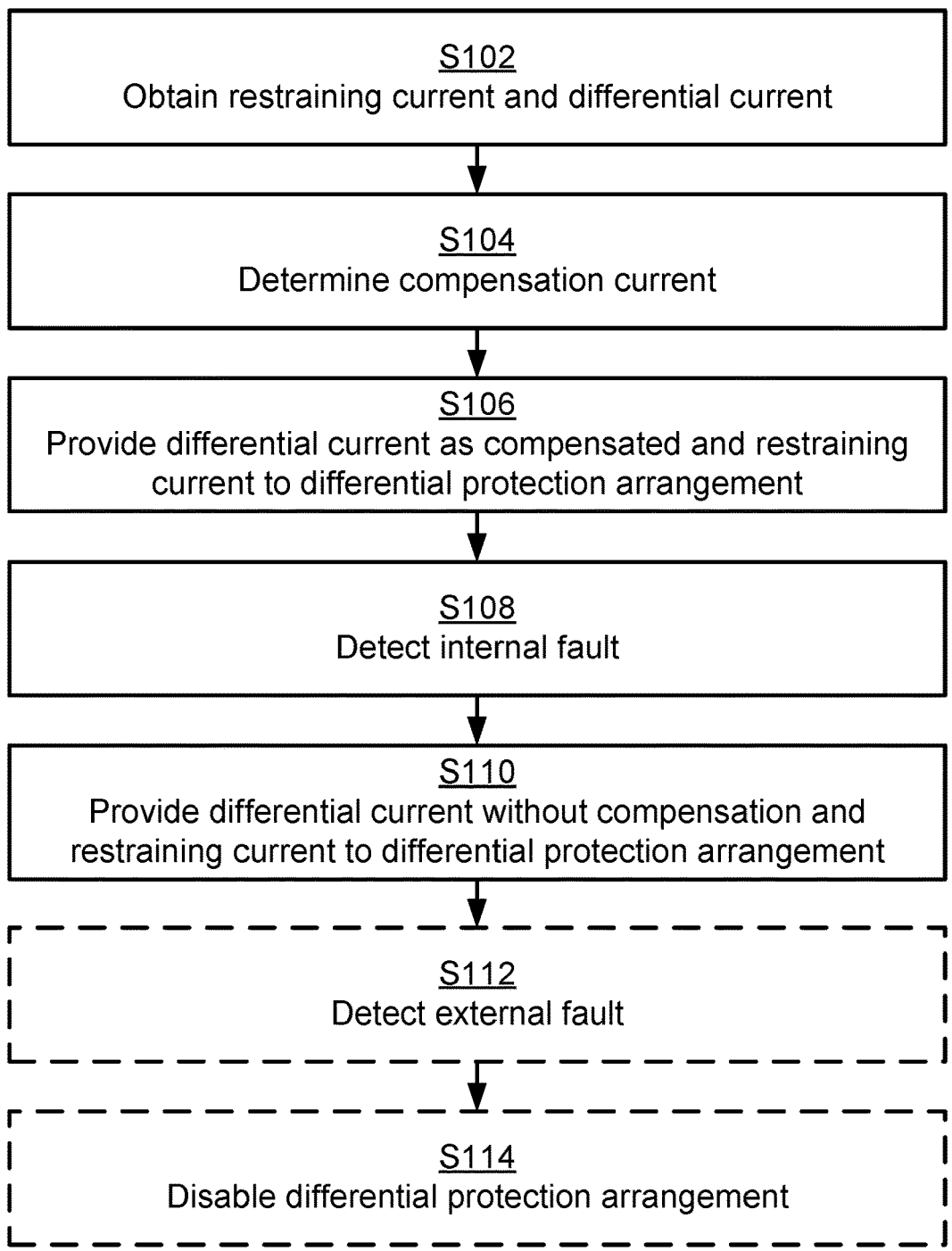
FIG. 13 is a flowchart of methods according to embodiments.

FIG. 13 is a flowchart illustrating embodiments of methods for differential protection of a transmission line 20 of a transmission system 25. The methods are performed by the arrangement 10a, 10b, 10c. The methods are advantageously provided as computer programs 1620.

S102: A restraining current $I_{res}$ and a differential current $I_d$ are obtained from the transmission line 20.

The restraining current $I_{res}$ and the differential current $I_d$ of each phase A, B, C be calculated as in equations (3)-(8). During normal conditions, i.e., when no fault occurs, the differential current represents a transmission line leakage current for the transmission system 25.

S104: A compensation current is determined for the differential current. According to an embodiment the compensation current is a capacitive compensation current.

S106: The differential current as compensated for by the compensation current and the restraining current are provided to the differential protection arrangement 1210 for making a trip decision. With reference to FIG. 12, the internal fault detection switch is thus set to position A, and the external fault detection switch is set to position B.

S108: An internal fault F2 is detected for the transmission system 25.

S110: As a result of the internal fault having been detected (as in step S108) the differential current without being compensated for by the compensation current and the restraining current are provided to the differential protection arrangement 1210 for making the trip decision. With reference to FIG. 12, the internal fault detection switch is thus set to position B, and the external fault detection switch is set to position B.

In this respect, in a three phase AC transmission system, the differential currents and restraining currents are phase segregated, which means that there are three differential currents and three restraining currents. Each phase will have one differential current and one restraining current and hence there is one differential protection scheme per phase. These three differential protection schemes (one in each phase) are run in parallel to define the overall differential protection scheme. As an example, if there is a fault in phase A, the differential protection function for phase A will detect the fault, and trip phase A. As a further example, if there is a fault involved with phase A and phase B, both the differential protection schemes for phase A and phase B will detect the faults and send trips to the circuit breakers for phase A and phase B to isolate the fault, and so on.

Embodiments relating to further details of differential protection of the transmission line 200 of the transmission system 25 as performed by the arrangement 10a, 10b, 10c will now be disclosed.

The compensation current might be determined such that during normal operation the compensated differential current is zero. With reference to FIG. 12, the external fault detection switch is thus set to position A.

As disclosed above, e.g., with reference to FIG. 2, the transmission system 25 is representable as a positive sequence network. The restraining current $I_{res}$ and the differential current $I_d$ might then be obtained by being calculated from parameters of the positive sequence network.

In some aspects an external fault F1 is detected and hence steps S112 and S114 are performed:

S112: An external fault F1 is detected for the transmission system 25.

S114: As a result of the external fault having been detected the differential protection arrangement 1210 is disabled from making the trip decision. In some embodiments, the differential protection arrangement 1210 is disabled from making any trip decision by providing the differential current as set to zero and the restraining current being provided to the differential protection arrangement 1210 for making the trip decision. With reference to FIG. 12, the external fault detection switch is thus set to position A.

It might here be assumed that if a fault occurs, the fault is either an internal fault F2 or an external fault F1. This does not exclude that two or more faults might occur time-wise one after the other, where the time-wise first occurring fault is either an internal fault F2 or an external fault F1, and where the time-wise second occurring fault is either an internal fault F2 or an external fault F1, and so on. Which action, or step, to be perform thus depends on what type of fault is detected.

Thus, an alternative way of formulating the invention is to, upon having obtained the restraining current $I_{res}$ and a differential current $I_d$ determining whether to apply a compensation current or not (before being provided to the differential protection arrangement 1210 for making the trip decision) depending on whether no fault has been detected, whether an internal fault has been detected, or whether an external fault has been detected. The compensation current is not applied when the internal fault has been detected. The differential protection arrangement 1210 is disabled from making any trip decision when the external fault has been detected. The differential current might be set to zero when the external fault has been detected. The compensation current is applied when no fault has been detected. This can be achieved by setting the positions of the external fault detection switch and the internal fault detection switch as disclosed above.

Hence, according to an alternative formulation of the invention, the restraining current $I_{res}$ and the differential current $I_d$ are obtained. It is then checked whether no fault has been detected, an internal fault has been detected, or an external fault has been detected. When no fault has been detected, a compensation current is determined and the differential current as compensated for by the compensation current and the restraining current are provided to the differential protection arrangement 1210 for making a trip decision. When an internal fault has been detected the differential current without being compensated for by any compensation current and the restraining current are provided to the differential protection arrangement 1210 for making the trip decision. When an external fault has been detected the differential current as set to zero and the restraining current are provided to the differential protection arrangement 1210 for making the trip decision. In this respect, during external faults, the restraining current, which is summation of the average absolute values of all terminal currents, will be higher. Since the differential current is zero, the differential protection based on equation (9), that is, the condition $I_{d\_a\_rms}(t) - k1 \times I_{res\_a\_rms}(t) > \text{Threshold1}$ will not be fulfilled, hence ensuring security of the differential protection. Again, this can be achieved by setting the positions of the external fault detection switch and the internal fault detection switch as disclosed above.

The restraining current for an M-terminal transmission system 25 at time t is denoted $I_{res,x}(t)$ and is defined as:

$$I_{res,x}(t) = \frac{(|I_{s,1,x}(t)| + |I_{s,2,x}(t)| + \ldots + |I_{s,M,x}(t)|)}{M}, \qquad (18)$$

where $I_{s,m,x}(t)$ represents instantaneous current at time t from terminal m along the transmission line 20 for phase x, where $x \in \{A, B, C\}$ for a 3-phase transmission system 25 with phases A, B, C.

Figure 14:
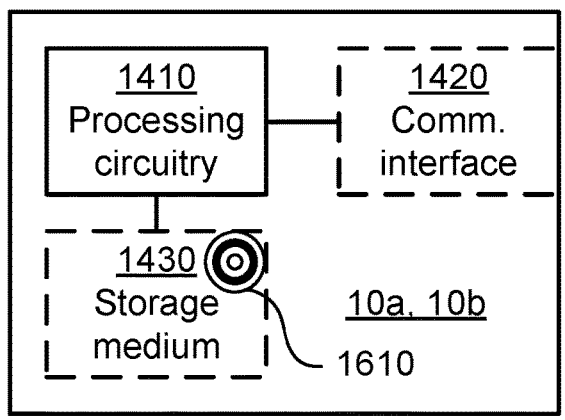
FIG. 14 is a schematic diagram showing functional units of an arrangement according to an embodiment.

FIG. 14 schematically illustrates, in terms of a number of functional units, the components of an arrangement 10a, 10b, 10c for differential protection of the transmission line 20 of the transmission system 25 according to an embodiment. Processing circuitry 1410 is provided using any combination of one or more of a suitable central processing unit (CPU), multiprocessor, microcontroller, digital signal processor (DSP), etc., capable of executing software instructions stored in a computer program product 1610 (as in FIG. 16), e.g. in the form of a storage medium 1430. The processing circuitry 1410 may further be provided as at least one application specific integrated circuit (ASIC), or field programmable gate array (FPGA).

Particularly, the processing circuitry 1410 is configured to cause the arrangement 10a, 10b, 10c to perform a set of operations, or steps, as disclosed above. For example, the storage medium 1430 may store the set of operations, and the processing circuitry 1410 may be configured to retrieve the set of operations from the storage medium 1430 to cause the arrangement 10*a*, 10*b*, 10*c* to perform the set of operations. The set of operations may be provided as a set of executable instructions.

Thus the processing circuitry 1410 is thereby arranged to execute methods as herein disclosed. The storage medium 1430 may also comprise persistent storage, which, for example, can be any single one or combination of magnetic memory, optical memory, solid state memory or even remotely mounted memory. The arrangement 10*a*, 10*b*, 10*c* may further comprise a communications interface 1420 at least configured for obtaining current values from the transmission system 25, to provide current values to the differential protection arrangement 1210, and for communications with another arrangement 10*a*, 10*b*, 10*c*. As such the communications interface 1420 may comprise one or more transmitters and receivers, comprising analogue and digital components. The processing circuitry 1410 controls the general operation of the arrangement 10*a*, 10*b*, 10*c* e.g. by sending data and control signals to the communications interface 1420 and the storage medium 1430, by receiving data and reports from the communications interface 1420, and by retrieving data and instructions from the storage medium 1430. Other components, as well as the related functionality, of the arrangement 10*a*, 10*b*, 10*c* are omitted in order not to obscure the concepts presented herein.

Figure 15:
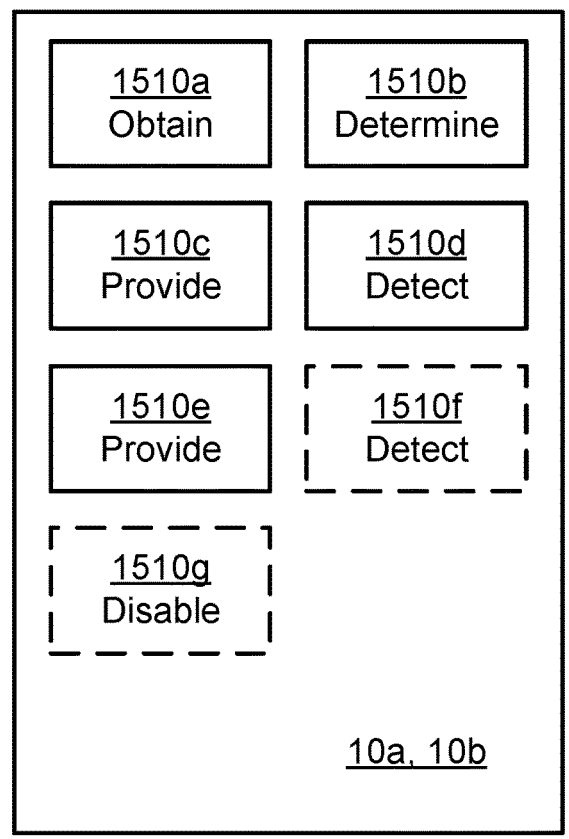
FIG. 15 is a schematic diagram showing functional modules of an arrangement according to an embodiment.

FIG. 15 schematically illustrates, in terms of a number of functional modules, the components of an arrangement 10*a*, 10*b*, 10*c* for differential protection of the transmission line 20 of the transmission system 25 according to an embodiment. The arrangement 10*a*, 10*b*, 10*c* of FIG. 15 comprises a number of functional modules; an obtain module 1510*a* configured to perform step S102, a determine module 1510*b* configured to perform step S104, a provide module 1510*c* configured to perform step S106, a detect module 1510*d* configured to perform step S108, and a provide module 1510*e* configured to perform step S110.

The arrangement 10*a*, 10*b*, 10*c* of FIG. 15 may further comprise a number of optional functional modules, such as any of a detect module 151 of configured to perform step S112, and a disable module 1510*g* configured to perform step S114. In general terms, each functional module 1510*a*-1510*g* may in one embodiment be implemented only in hardware and in another embodiment with the help of software, i.e., the latter embodiment having computer program instructions stored on the storage medium 1430 which when run on the processing circuitry makes the arrangement 10*a*, 10*b*, 10*c* perform the corresponding steps mentioned above in conjunction with FIG. 15. It should also be mentioned that even though the modules correspond to parts of a computer program, they do not need to be separate modules therein, but the way in which they are implemented in software is dependent on the programming language used. Preferably, one or more or all functional modules 1510*a*-1510*g* may be implemented by the processing circuitry 1410, possibly in cooperation with the communications interface 1420 and/or the storage medium 1430. The processing circuitry 1410 may thus be configured to from the storage medium 1430 fetch instructions as provided by a functional module 1510*a*-1510*g* and to execute these instructions, thereby performing any steps as disclosed herein.

Figure 16:
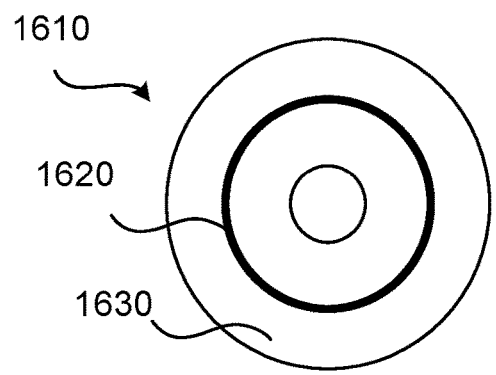
FIG. 16 shows one example of a computer program product comprising computer readable storage medium according to an embodiment.

FIG. 16 shows one example of a computer program product 1610 comprising computer readable storage medium 1630. On this computer readable storage medium 1630, a computer program 1620 can be stored, which computer program 1620 can cause the processing circuitry 1410 and thereto operatively coupled entities and devices, such as the communications interface 1420 and the storage medium 1430, to execute methods according to embodiments described herein. The computer program 1620 and/or computer program product 1610 may thus provide means for performing any steps as herein disclosed.

In the example of FIG. 16, the computer program product 1610 is illustrated as an optical disc, such as a CD (compact disc) or a DVD (digital versatile disc) or a Blu-Ray disc. The computer program product 1610 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1620 is here schematically shown as a track on the depicted optical disk, the computer program 1620 can be stored in any way which is suitable for the computer program product 1610.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for differential protection of a transmission line of a transmission system, the method comprising:
    obtaining a restraining current and a differential current from the transmission line;
    determining a compensation current for the differential current;
    providing the differential current as compensated for by the compensation current and the restraining current to a differential protection arrangement for making a trip decision;
    detecting an internal fault for the transmission system; and
    in response to detecting the internal fault, providing the differential current without being compensated for by the compensation current and the restraining current to the differential protection arrangement for making the trip decision.

2. The method according to claim 1, further comprising:
    detecting an external fault for the transmission system; and
    in response to detecting the external fault, disabling the differential protection arrangement from making any trip decision.

3. The method according to claim 2, wherein the differential protection arrangement is disabled from making any trip decision by providing the differential current as set to zero and the restraining current to the differential protection arrangement for making the trip decision.

4. The method according to claim 1, wherein the transmission system is representable as a positive sequence network and wherein the restraining current and the differential current are obtained by being calculated from parameters of the positive sequence network.

5. The method according to claim 1, wherein the compensation current is a capacitive compensation current.

6. The method according to claim 1, wherein the restraining current for an M-terminal transmission system at time t is denoted $I\_(res,x)$ (t) and is defined as:

$$I\_(res,x)(t)=((|I\_(s,1,x)(t)|+|I\_(s,2,x)(t)|+ \ldots +|I\_(s,M,x)(t)|))/M,$$

where I_(s,m,x) (t), with m ranging from 1 to M, represents instantaneous sent current at time t from terminal m along the transmission line for phase x, where x∈{A,B,C} for a 3-phase transmission system with phases A,B,C.

7. The method according to claim 1, wherein the compensation current is determined such that during normal operation the compensated differential current is zero.

8. The method according to claim 1, wherein the transmission line is an ultra high voltage transmission line.

9. The method according to claim 1, wherein the transmission line is part of a power distribution system.

10. An arrangement for differential protection of a transmission line of a transmission system, the arrangement comprising processing circuitry, the processing circuitry being configured to cause the arrangement to:
obtain a restraining current and a differential current from the transmission line;
determine a compensation current for the differential current;
provide the differential current as compensated for by the compensation current and the restraining current to a differential protection arrangement for making a trip decision;
detect an internal fault for the transmission system; and
in response to detecting the internal fault, provide the differential current without being compensated for by the compensation current and the restraining current to the differential protection arrangement for making the trip decision.

11. The arrangement according to claim 10, wherein the processing circuitry further is configured to cause the arrangement to:
detect an external fault for the transmission system, and
in response to detecting the external fault, disable the differential protection arrangement from making any trip decision.

12. The arrangement according to claim 11, wherein the processing circuitry further is configured to cause the arrangement to disable the differential protection arrangement from making any trip decision by providing the differential current as set to zero and the restraining current to the differential protection arrangement for making the trip decision.

13. The arrangement according to claim 10, wherein the transmission system is representable as a positive sequence network, and wherein the processing circuitry further is configured to cause the arrangement to obtain the restraining current and the differential current by calculating from parameters of the positive sequence network.

14. The arrangement according to claim 10, wherein the compensation current is a capacitive compensation current.

15. The arrangement according to claim 10, wherein the restraining current for an M-terminal transmission system at time t is denoted I_(res,x) (t) and is defined as:

$$I\_(res,x)(t)=((|I\_(s,1,x)(t)|+|I\_(s,2,x)(t)|+ \ldots +|I\_(s,M,x)(t)|))/M,$$

where I_(s,m,x) (t), with m ranging from 1 to M, represents instantaneous sent current at time t from terminal m along the transmission line for phase x, where x∈{A,B,C} for a 3-phase transmission system with phases A,B,C.

16. The arrangement according to claim 10, wherein the compensation current is determined such that during normal operation the compensated differential current is zero.

17. The arrangement according to claim 10, wherein the transmission line is an ultra high voltage transmission line.

18. The arrangement according to claim 10, wherein the transmission line is part of a power distribution system.

19. The arrangement according to claim 10, wherein the processing unit is part of an Intelligent Electronic Device comprised in the arrangement.

20. A computer program for differential protection of a transmission line of a transmission system, the computer program comprising computer code which, when run on processing circuitry of an arrangement, causes the arrangement to:
obtain a restraining current and a differential current from the transmission line;
determine a compensation current for the differential current;
provide the differential current as compensated for by the compensation current and the restraining current to a differential protection arrangement for making a trip decision;
detect an internal fault for the transmission system; and
in response to detecting the internal fault, provide the differential current without being compensated for by the compensation current and the restraining current to the differential protection arrangement for making the trip decision.

21. A computer program product comprising a non-transitory computer readable storing the computer program according to claim 20, and a computer readable storage medium on which the computer program is stored.

* * * * *